(12) United States Patent
Salsman

(10) Patent No.: US 8,969,778 B2
(45) Date of Patent: Mar. 3, 2015

(54) PLASMONIC LIGHT COLLECTORS

(71) Applicant: Aptina Imaging Corporation, George Town, Cayman Islands (KY)

(72) Inventor: Kenneth Edward Salsman, Pleasanton, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/222,215

(22) Filed: Mar. 21, 2014

(65) Prior Publication Data
US 2014/0270640 A1    Sep. 18, 2014

Related U.S. Application Data

(62) Division of application No. 13/365,051, filed on Feb. 2, 2012, now Pat. No. 8,680,455.

(60) Provisional application No. 61/439,864, filed on Feb. 5, 2011, provisional application No. 61/529,584, filed on Aug. 31, 2011.

(51) Int. Cl.
*H01J 3/14*    (2006.01)
*H01J 5/16*    (2006.01)
*G02B 6/122*    (2006.01)
(Continued)

(52) U.S. Cl.
CPC .............. *G02B 6/1226* (2013.01); *G02B 5/008* (2013.01); *H01L 27/14627* (2013.01); *H01L 27/14629* (2013.01); *H01L 27/14621* (2013.01); *G02B 2006/12085* (2013.01)
USPC ....................................... 250/208.1; 250/216

(58) Field of Classification Search
CPC ....................................................... G02B 5/008
USPC ............................................... 250/208.1, 216
See application file for complete search history.

(56) References Cited

U.S. PATENT DOCUMENTS 6,708,275 B1 *   3/2004   Stolz ................................ 726/4
7,085,220 B2 *   8/2006   Fujikata et al. ............... 369/118
(Continued)

OTHER PUBLICATIONS

Sasagawa et al., "Dual-layer Metal-grid Polarized for Polarization Image Sensor in 65-nm CMOS Technology", 4 pages, IEEE.
(Continued)

*Primary Examiner* — Georgia Y Epps
*Assistant Examiner* — Renee D Chavez
(74) *Attorney, Agent, or Firm* — Treyz Law Group; Michael H. Lyons

(57) ABSTRACT

An electronic device may be provided with imaging modules or communications modules. Imaging modules and communications modules may be improved with the use of plasmonic light collectors. Plasmonic light collectors exploit the interaction between incoming light and plasmons in the plasmonic light collector to redirect the path of the incoming light. Plasmonic light collectors may be used to form lenses for image pixels in an imaging module or to form light pipes or lenses for use in injecting optical communications into a fiber optic cable. Plasmonic lenses may be formed by lithography of metallic surfaces, by implantation or by stacking and patterning of layers of materials having different dielectric properties. Plasmonic image pixels may be smaller and more efficient than conventional image pixels. Plasmonic light guides may have significantly less signal loss than conventional lenses and light guides.

19 Claims, 4 Drawing Sheets

(51) Int. Cl.
*G02B 5/00* (2006.01)
*H01L 27/146* (2006.01)
*G02B 6/12* (2006.01)

(56) References Cited

U.S. PATENT DOCUMENTS

| | | | |
|---|---|---|---|
| 7,154,820 B2 | 12/2006 | Nakada et al. | |
| 7,697,799 B2 | 4/2010 | Furuyama | |
| 7,772,555 B2* | 8/2010 | Hollingsworth | 250/338.1 |
| 2007/0223940 A1* | 9/2007 | Smolyaninov et al. | 398/214 |
| 2010/0189402 A1* | 7/2010 | Schrauwen et al. | 385/129 |
| 2012/0211644 A1 | 8/2012 | Yang et al. | |

OTHER PUBLICATIONS

Catrysse et al., "Integrated Color Pixels in 0.18-um Complementary Metal Oxide Semiconductor Technology", 2003, 14 pages (2293-2036), vol. 20, No. 12, J. Opt. Soc, Am. A, Optical Society of America.

Chen et al., "High Transmission and Low Color Cross-talk Plasmonic Color Filters Using Triangular-lattice Home Arrays in Aluminum Films", 2010, 13 pages, vol. 18, No. 13, Optics Express, Optical Society of America.

* cited by examiner

PLASMONIC LIGHT COLLECTORS

This application is a division of patent application Ser. No. 13/365,051, filed Feb. 2, 2012, which claims the benefit of provisional patent application No. 61/439,834, filed Feb. 4, 2011, and provisional patent application No. 61/529,584, filed Aug. 31, 2011 all of which are hereby incorporated b reference herein in their entireties. This application claims the benefit of and claims priority to patent application Ser. No. 13/365,051, filed Feb. 2, 2012, provisional patent application No. 61/439,834, tiled Feb. 4, 2011, and provisional patent application No. 61/529,584, filed Aug. 31, 2011.

BACKGROUND

This relates generally to electronic devices, and more particularly, to electronic devices having plasmonic light collectors.

Plasmonic effects are quantum surface field effects in which an evanescent wave of election density oscillations is generated on or near a surface of a metal or meta-material in response to incident photons. In structures designed to exhibit plasmonic effects, incoming photons incident on the plasmonic structure generate plasmons associated with high intensity electromagnetic fields within nano-scale distances from the surface of the structure. These high intensity electromagnetic, fields couple to the incoming photons and affect the path of travel of the photon near the plasmonic surface.

Plasmonic structures that affect visible light (i.e., light in the visible part of the electromagnetic spectrum) require lithographic patterning and material height differences on the surface of the structures with dimensions of greater than 400 nanometers. Typical semiconductor volume manufacturing facilities lack such lithography capabilities. These material height requirements have therefore restricted the use of visible light plasmonic structures in electronic devices such as imaging devices and communications devices.

It would therefore be desirable to be able to provide improved plasmonic structures for use in imaging and communications devices.

DETAILED DESCRIPTION

Electronic devices such as digital cameras, computers, cellular telephones, or other electronic devices widely include imaging and communications modules. Imaging modules in these devices ma use one or more lenses to focus incoming light onto corresponding image sensors in order to capture a corresponding digital image. Communications modules in these devices may use one or more lenses to focus incoming light into transmission cables. Image sensors may include arrays of image sensor pixels. The pixels in the image sensors may include photosensitive elements such as photodiodes that convert the incoming light into digital data signals. Image sensors may have any number of pixels (e.g., hundreds or thousands or more). A typical image sensor may, for example, have millions of pixels (e.g., megapixels). In high-end equipment, image sensors with ten megapixels or more are not uncommon. Communications modules in electronic devices may include light generating transmitter elements in addition to light focusing elements (lenses) designed to direct information encoded on electromagnetic waves (light) into a communications cable.

Figure 1:
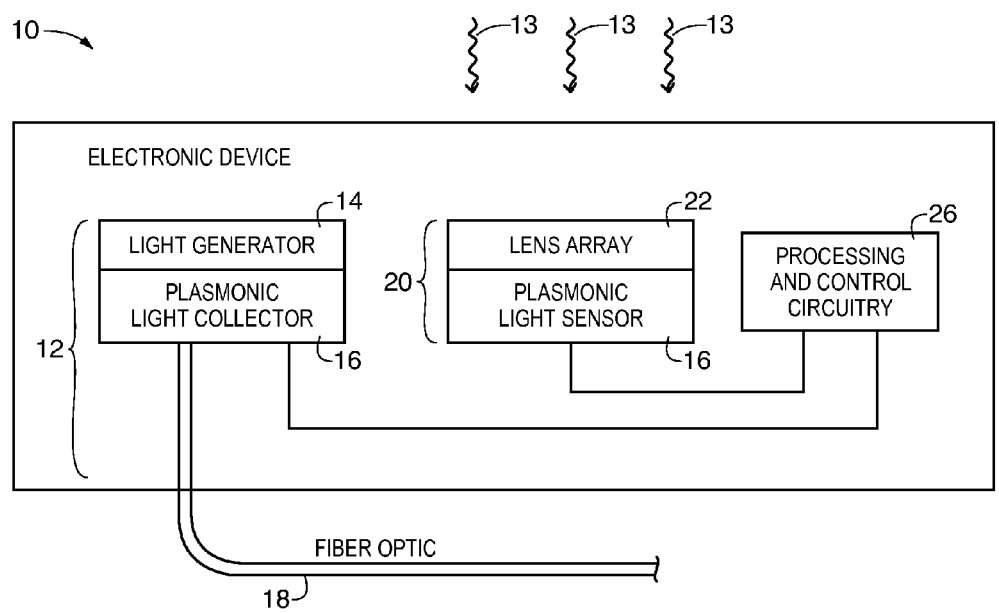
FIG. 1 is a diagram of an illustrative electronic deice in accordance with an embodiment of the present invention.

FIG. 1 shows an electronic device in accordance with an embodiment of the present invention. As shown in FIG. 1, electronic device 10 may include a communications module such as communications module 12 for generating an transmitting communications, an imaging module such as imaging module 20 for capturing an image, and processing circuitry 26 for processing data and information captured, generated or received by communications module 12 or image module 20. Imaging module 20 may be configured to receive incoming image light 13 from an external object. Lenses in lens array 22 may be used to focus image light 13 onto a plasmonic light collector such as plasmonic light collectors 16. Plasmonic light collectors 16 may contain an array of image pixels that collect, filter and convert the image light into digital image data. The digital image data may be processed b processing and control circuitry 26.

Circuitry 26 may be incorporated into imaging module 20 and/or may be implemented using external processing, circuitry (e.g., a microprocessor, an application-specific integrated circuit, etc.). Processing circuitry 26 may include one or more integrated circuits (e.g., image processing circuits, microprocessors, storage devices such as random-access memory and non-volatile memory, etc.) and may be implemented using components that are separate from imaging module 20 and/or that form part or imaging module 20 (e.g., circuits that form pan of an integrated circuit that includes plasmonic light collector 16 or an integrated circuit within module 20 that is associated with plasmonic light collector 16). Image data that has been captured by imaging module 12 may be processed and stored using processing circuitry 26. Processed image data may, if desired, be provided to external equipment (e.g., a computer or other device) using wired and/or wireless communications paths coupled to processing circuitry 26.

To provide plasmonic light collector 16 with the ability to detect light of different colors, plasmonic light collector 16 may be provided with a color filter array. Image pixels of plasmonic light collector 16 may be associated with a pattern of color filter elements in which blue elements alternate with green elements in some rows and in which green elements alternate with red elements in other rows. This is merely illustrative. Plasmonic light collector 16 may, if desired, be a grayscale image sensor or alternatively or in addition to a color filter array, plasmonic light collector 16 may be a color-sensitive image sensor in which plasmonic image pixels may be individually configured to preferably accept a given color of light. Arrangements in which plasmonic light collector 16 is a color-sensitive image sensor are sometimes described herein as an example.

As shown in FIG. 1, communications module 12 may include a light generating transmitter module such as light generator 14 (sometimes referred to herein as light generating module, light emitting module, transmitter, transmitting module, light transmitting module, etc.). Light generator 14 may, for example, include one or more light-emitting diodes, laser transmitters or other optical transmitter. Communications module 12 may also include a plasmonic light collector such as plasmonic light collectors 16. Plasmonic light collector 16 of communications module 12 may be used to focus light generated using light generator 14 into a communications cable such as fiber optic cable 18. Fiber optic cable 18 may be used couple communications module 12 to a communications network such as a local area network, a telephone network, an interconnected network of computers, cable television network, etc. Processing and control circuitry 26 may be used to control light generator 14 of communications module 12 (i.e., to pass electrical signals containing information to be converted into electromagnetic signals containing the information by light generator 14).

Figure 2:
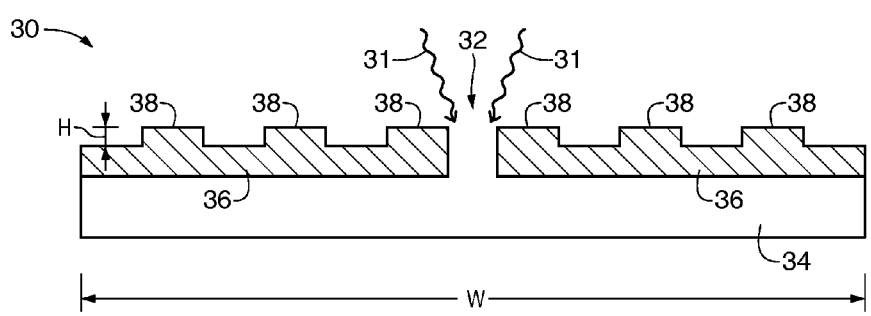
FIG. 2 is a cross-sectional side view of a conventional plasmonic lens for use in plasmonic lens research.

A conventional plasmonic lens that may be used in plasmonic lens research is shown in FIG. 2. As shown in FIG. 2, plasmonic lens 30 receives incoming light 31. Plasmonic lens 30 helps concentrate light 31 into opening 32 in plasmonic lens 30. Plasmons may be defined as oscillations of free electrons in a material such as a noble metal, a doped dielectric material or other material having free electrons. Surface plasmons occur at or near a surface at which a metal or other material having a negative effective dielectric constant interfaces with a vacuum or other material having a positive dielectric constant. At such an interfacing surface, evanescent waves of electrons are generated due to the presence of incoming incident photons. Surface plasmons resulting from the evanescent waves of electrons interact with the incoming photons and affect the path of travel of the incoming photons. Surface features may be designed on the surface of a metal at the interface with a vacuum or other positive dielectric constant material) that purposefully guide photons such that the surface features effectively acts as a plasmonic lens (i.e., light waves are redirected through openings in the plasmonic lens through interaction with surface plasmons).

As shown in FIG. 2, conventional plasmonic lens 30 is formed from a patterned metal such as metal layer 36 formed on a substrate such as substrate 24 (e.g., a supporting structure formed from silicon). Surface features such as surface features 38 are typically configured to form concentric rings surrounding opening 32 in plasmonic lens 36. Electromagnetic fields associated with plasmons generated near the surface of metal layer 36 cause incoming light 31 to be redirected into opening 32. Conventional plasmonic lenses have surface features 38 having a typical height such as height H with a magnitude of less than 10 nanometers and a width W (as shown in FIG. 2) of 50-200 nanometers. Current lithographic and etch procedures for producing surface features such as surface features 38 limit the use of conventional plasmonic lenses such as lens 30 in communications and imaging modules of electronic devices. Incorporating plasmonic lenses into imaging modules such as imaging module 20 of device 10 ma include forming arrays of plasmonic lenses and corresponding, image sensors as shown in FIG. 3A.

Figure 3A:
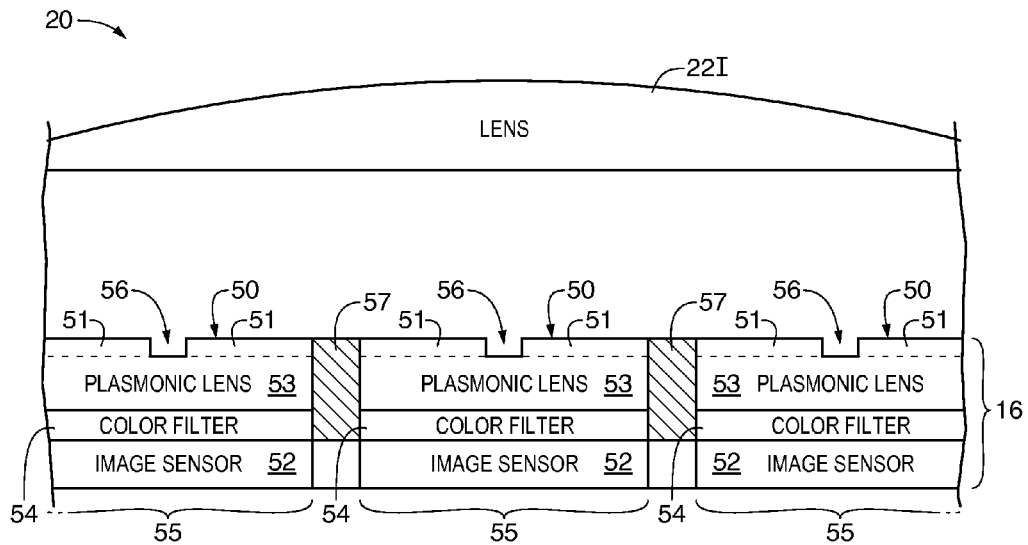
FIG. 3A is a cross-sectional side view of a portion of an illustrative imaging device having an array of plasmonic lenses in accordance with an embodiment of the present invention.

FIG. 3A is a cross-sectional side view of an imaging module such as imaging module 20 of electronic device 10 of FIG. 1. In the example of FIG. 3A, lens array 22 may include one or more lenses 221 configured to focus light on the plasmonic light collector 16. Plasmonic light collector 16 may include an array of plasmonic lenses such as plasmonic lenses 50. Plasmonic lenses 50 may be configured to focus light onto corresponding image sensors such as image sensors 52. Each plasmonic lens 50 may have an associated color filter such as color filters 54. Plasmonic lenses 50 may be configured such that surface plasmons resulting from evanescent waves of electrons generated by incoming photons interact with the incoming photons and affect the path of travel of the incoming photons. Plasmonic lenses 50 may include a layer such as layer 51 formed on substrate 53. Layer 51 may (as art example) include a metal layer formed on substrate 53. In the example in which layer 51 includes a metal layer formed on substrate 53, layer 51 may include surface features the surface of the layer 51 con figured to generate plasmons on the surface of layer 51 in response to light. Surface features may include one or more concentric rings on the surface of layer 51 surrounding openings such as openings 56 in layer 51 of plasmonic lens 50. The example in which layer 51 includes a metal layer having surface features is merely illustrative. Layer 51 may be formed from materials other than metal (e.g., silicon or other dielectric, meta-materials, etc.), may be formed from layers of materials of different dielectric constants, may be formed by implantation of a material having one dielectric constant into another material having a different dielectric constant or may be otherwise formed (e.g., implanted, layered, patterned, etc.) such that, incoming photons are redirected into openings such as openings 56 in portions of plasmonic lenses 50. Plasmonic lenses may be configured to guide a light of a single color (e.g., red light, blue light, green light, infrared light, x-ray wavelength light, ultra-violet light, etc.), a combination of individual colors, or wide continuous range of colors of light into openings 56.

In an array of numerous plasmonic lenses 50 and corresponding image sensors 52, some of the image sensors may have red filters, some may have blue color filters, some may have green color filers, some may have patterned ed color filters (e.g., Bayer pattern filters, etc.), some may have infrared-blocking filters, some may have ultraviolet light blocking filters, some may be visible-light-blocking-and-infrared-passing filters, etc. Plasmonic lenses 50 may be associated with combinations of two or more, three or more, or four or more of these filters or may have filter of only one type. Image sensors 52 may include one or more photosensitive elements such as photodiodes. In the example of FIG. 3A, incoming light is collected by the photodiode of image sensor 52 after passing through opening 56 in plasmonic lens 50 and, if desired, through color filter 54. Incoming light may then be converted by the photodiode into electrical charge.

Image sensors 52 may include components such as reset transistors charge storage nodes (also referred to as floating diffusion FD nodes) transfer transistors (transfer gates) or other components. Charge storage nodes may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from a piton:Rhode which has collected light that has passed through plasmonic lens 50. The signal associated with the stored charge on the floating diffusion node (sometimes referred to herein as image data) may be conveyed to processing and control circuitry 26 of electronic device 10 (see FIG. 1) through components such as row select transistors, source-follower transistors, or other components.

Image data that has been captured by imaging module 20 may be processed and stored using processing and control circuitry 26. Processed image data may, if desired, be provided to external equipment (e.g., a computer or other device)

using wired and/or wireless communications paths coupled to processing and control circuitry 26.

Image pixels 55 may be formed in an array of image pixels for imaging module 20. Each image pixel 55 may include a plasmonic lens such as plasmonic lens 50, an image sensor 52 and, if desired, a color filter such as color filter 54. Image pixels 55 may be separated by separating structures 57. Separating structures 5 i may be a disruptive implant formed from dielectric material such as silicon or other acceptable materials that have been processed to form barriers between components of each pixel 55.

Figure 3B:
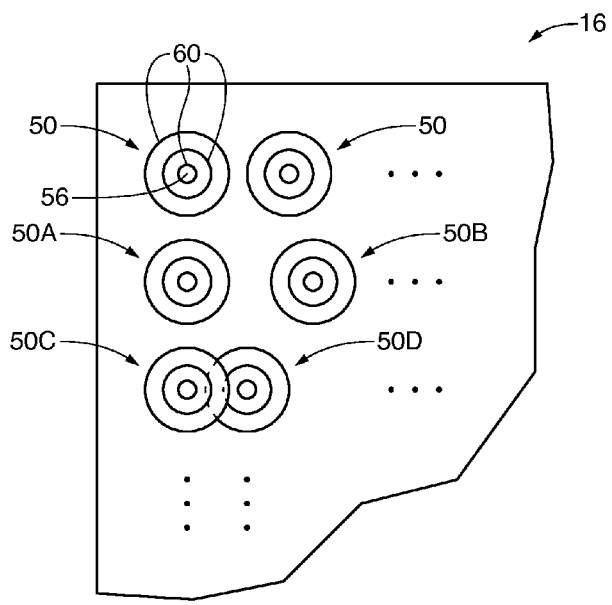
FIG. 3B is a top view of an illustrative imaging device such as the imaging device of FIG. 3A in accordance with an embodiment of the present invention.

Plasmonic lenses such as plasmonic, lenses 50 of plasmonic light collector 16 have the advantage over conventional lenses that plasmonic structures used to firm one plasmonic lens 50 may overlap plasmonic structures used to form another plasmonic lens 50 without interference. FIG. 3B is a top-view of a plasmonic light collector such as plasmonic light collector 16 of FIG. 3A. As shown in FIG. 3, plasmonic lenses 50 may be formed from one or more concentric rings 60 surrounding opening 56 in plasmonic lens 50. Concentric rings 60 may be formed from lithographed or etched metal or other material, may be formed from implanted material having one dielectric constant in another material having a different dielectric constant, or may be formed using other suitable methods. Light having chosen frequencies (colors) may be allowed to pass through opening 56 in plasmonic lens 50 by adding more or fewer rings having ring widths and ring diameters tuned to interact with light of the chosen frequency. The example of FIG. 3B in which plasmonic lenses 50 of plasmonic light collector 16 have concentric rinses of material is merely illustrative. Other structures such as structures formed from layered materials in which alternating materials have different dielectric constants may be used to form plasmonic lenses 50.

As shown in FIG. 3B, plasmonic lenses 50 may be formed separately as in the example of plasmonic lenses 50A and 50B or may be overlapping as in the example of plasmonic lenses 50C and 50D.

Figure 4:
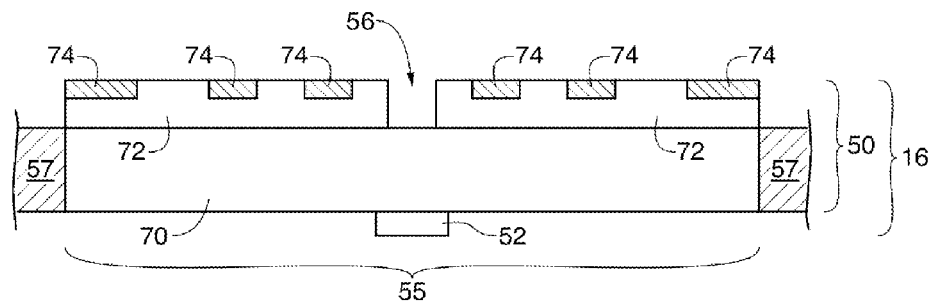
FIG. 4 is a cross-sectional side view of an illustrative plasmonic lens formed by implantation in accordance with an embodiment of the present invention.

FIG. 4 shows a cross-sectional side view of an illustrative plasmonic lens of the type that may be used in imaging module 20 of electronic device 10 of FIG. 1. In the example of FIG. 4, plasmonic lens 50 is formed using an implantation process (i.e., a process in which ions, noble metal atoms, other charged particles, or other suitable materials are implanted in a layer of dielectric material having a positive dielectric constant in order to form regions having negative effective dielectric constant in dielectric layer). As shown in FIG. 4, plasmonic lenses 50 may include a substrate support structure such as substrate support structure 70. Substrate 70 may be formed from silicon, silicon dioxide, sapphire, aluminum oxide, of other suitable materials. Plasmonic lens 50 may include a dielectric layer such as dielectric layer 72. Dielectric laser 72 may be formed from ally suitable dielectric (e.g., nitride, polyimide or other suitable materials). Plasmonic structures such as plasmonic structures 74 may be formed within dielectric layer 72 using implantation methods in which a noble metal (e.g., gold) or other material is implanted in dielectric layer 72 in order to form regions of dielectric layer 72 having a negative effective dielectric constant (i.e., regions with metallic properties). As an example, dielectric layer 72 may be coated with a photo-resistive material and patterned using electron beam lithography before being implanted with a suitable material (e.g., gold, titanium oxide, or other material) to form plasmonic structures 74 having a negative effective dielectric constant.

Plasmons that interact with incoming light ma be formed at the interface between any positive dielectric material and any negative effective dielectric material. For this reason, changes in the local dielectric function produced by plasmonic structures 74 in plasmonic lens 50 may produce the same plasmonic lens properties of the lithographed plasmonic lens of FIG. 2. Plasmonic lens 50 may therefore be used in any application for which plasmonic lens 30 of FIG. 2 may be used. Plasmonic lens 50, however, has the advantage that at least one process step (i.e., lithography of a metal layer to form nano-scale surface features) is not required. Replacing metal lithography with an implant process in the formation of plasmonic lens 50 (as described in connection with FIG. 4) may provide a variety of performance control options in constructing plasmonic structures 74 (e.g., control over shape, size, depth, etc. of plasmonic structures 74). Plasmonic structures 74 may be formed surrounding opening 56 in plasmonic lens 50. As an example, plasmonic structures 74 may be configured to form concentric rings surrounding opening 56 in plasmonic lens 56 such that incoming light is guided (or focused) into opening 56. Light that has been focused into opening 56 may pass through substrate 70 and be collected by image sensor 52. As described in connection with FIG. 3A, image sensor 52 may include a photosensitive element such as photodiode that converts incoming light into electrical charge. An electrical signal associated with the electrical charge produced by the photodiode may be conveyed to processing and control circuitry 26 of electronic device 10 (see FIG. 1) through components such as row select transistors, source-follower transistors, or other components. Plasmonic lens 50 and image sensor 52 may be combined to form a plasmonic image pixel such as plasmonic image pixel 55. If desired, one or more plasmonic pixels 55 may be combined to form a plasmonic light collector such as plasmonic light collector 16 of imaging module 20 of device 10. Two or more image pixels such as image pixel 55 may be combined to form an array of image pixels for plasmonic light collector 16. Image pixels 55 may be separated from neighboring image pixels using separating structures 57. Separating structures 57 may be formed from dielectric material such as silicon or other acceptable materials that have been processed to firm electrical barriers between components of each pixel 55.

Figure 5:
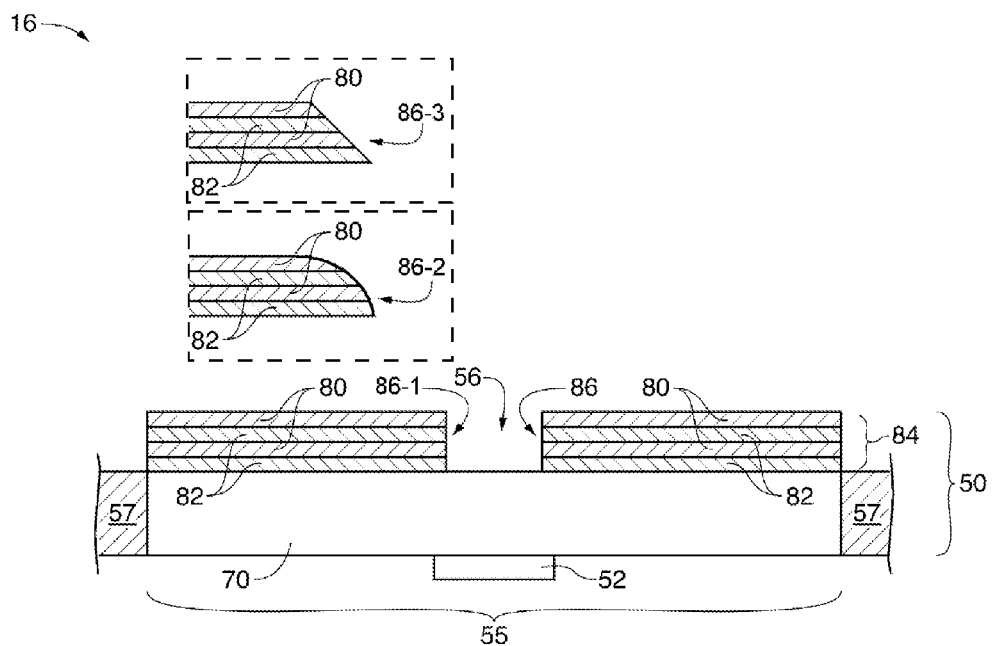
FIG. 5 is a cross-sectional side view of an illustrative plasmonic lens formed by layering alternating dielectric materials in accordance with an embodiment of the present invention.

FIG. 5 shows a cross-sectional side view of another illustrative embodiment of a plasmonic lens of the type that may be used in imaging module 20 of electronic device 10 of FIG. 1. In the example of FIG. 5, plasmonic lens 50 is formed using layers of material having alternating dielectric properties e.g., a vertical stack of two or more materials or a material stack with a variation in its dielectric properties due to composition or density). As shown in FIG. 5, plasmonic lenses 50 may be formed from two or more layers such as layers 80 and 82. If desired, layers 80 and 82 may be formed on the surface of substrate 70 in an alternating stack. Layers 80 and 82 may have different dielectric properties. For example, layer 80 may be a dielectric layer. Dielectric layer 80 may be formed from any suitable dielectric (e.g., nitride, polyimide or other suitable materials). Layer 82 may be formed using a noble metal (e.g., gold) or may be formed from a layer of metamaterial designed to have a negative effective dielectric constant. Layers 80 and 82 may be formed into a vertical stack by sequentially applying coatings to substrate 70 (i.e., forming a coating of metal material 82 on substrate 70 followed by forming a coating of dielectric material $0 on top of metal layer 82 followed by forming an additional coating of metal material 82 on top of dielectric layer 80, etc., until the desired stack has been formed). If desired, more than two layers of material having more than two corresponding effective dielectric constants may be used to control and focus incoming light in a chosen manner (e.g., to allow light of a chosen frequency to pass, to focus light on an image sensor. etc.).

As shown in FIG. 5, plasmonic lens 50 may be formed from material stack 84 (including layers 80, 82 and it desired, other layers) along with substrate 70. Plasmonic lens 50 may have an opening such an opening 56. Layers 80 and 82 may be formed such that incoming light incident on plasmonic lens 50 is focused into opening 56 due to interaction of the incoming light with plasmons formed on inner surface 86 of opening 56. Plasmons formed at or near inner surface 86 of opening 56 (sometimes referred to as plasmonic structure 86) may cause incoming light to pass through substrate 70 and onto image sensor 52. Opening 56 may be formed in plasmonic lens 50 during a layering process (i.e., layers 80, 82 or other layers) may be screen printed or otherwise patterned onto substrate 70) such that opening 56 is left uncovered. In another example, layers 80, 82, or other layers may be formed onto substrate 70 and opening 56 may be opened later using a patterning method such as a lithography, dry etch, wet etch, or other suitable process to form a via or channel such as opening 56 having an (e.g., cylindrical) inner surface such as inner surface 86. Layers 80 and 82 may, if desired, be formed from a single material having regions with differing dielectric properties due to differences in composition or density within the material. Opening 56 in a single material having regions with differing dielectric properties due to differences in composition or density within the material may be formed using a patterning method such as a lithography, dry etch, wet etch, or other suitable process to form a via or channel such as opening 56 having a cylindrical inner surface such as inner surface 86.

As plasmons that interact with incoming light may be formed at the interface between any positive dielectric material and any negative effective dielectric material, the changes in the local dielectric function produced by plasmonic structure 86 opening 56 of plasmonic lens 50 may produce plasmonic lensing properties. Plasmonic lens 50, when formed by layering (and, if desired, patterning one or more openings) of materials such as materials 80 and 82, has the advantage that a process step (i.e., lithography of a metal layer to form nano-scale surface features) is not required. Replacing metal lithography with vertical stacking process in the formation of plasmonic lens 50 (as described in connection with FIG. 5) may provide a variety of performance control options in constructing plasmonic structures 86 (e.g., control over shape, size, depth, etc. of plasmonic structures 86). Inner surface 86 may, for example, be substantially vertical (i.e., perpendicular to the surface of substrate 70) as in 86-1, may be angled with respect to the surface of substrate 70 as in 86-3, or may have curved surfaces having changing angles with respect to the surface of substrate 70 that change as a function of distance from the surface of substrate 70 as in 86-2. Light that has been focused into opening 56 may pass through substrate 70 and be collected by image sensor 52.

As described in connection with FIG. 3A, image sensor 52 may include a photosensitive element such as photodiode that converts incoming light into electrical charge. An electrical signal associated with the electrical charge produced by the photodiode may be conveyed to processing and control circuitry 26 of electronic device 10 (see FIG. 1) through components such as row select transistors, source-follower transistors, or other components. Plasmonic lens 50 and image sensor 52 may be combined to form a plasmonic image pixel such as plasmonic image pixel 55. If desired, one or more plasmonic pixels 55 may be combined to form a plasmonic light collector such as plasmonic light collector 46 of imaging module 20 of device 10. Two or more image pixels such as image pixel 55 may be combined to form an array of image pixels for plasmonic light collector 16. Image pixels 55 may be separated from neighboring image pixels using separating structures 57. Separating structures 57 may be formed from dielectric material such as silicon or other acceptable materials that have been processed to form electrical harriers between components of each pixel 55.

Plasmons formed on inner surface 86 of opening 56 may interact with light that has entered opening 56 such that inner surface 86 functions as a light pipe that redirects incoming light along opening 56 without penetration of the electromagnetic fields of the light entering into layers 80 or 82. This lack of penetration of electromagnetic fields into the materials that form the inner surface of the light pipe may enhance the efficiency with which light may be passed through opening 56 (i.e., light will not be absorbed by materials 80 and 82 as the light never contacts materials 80 and 82).

Figure 6:
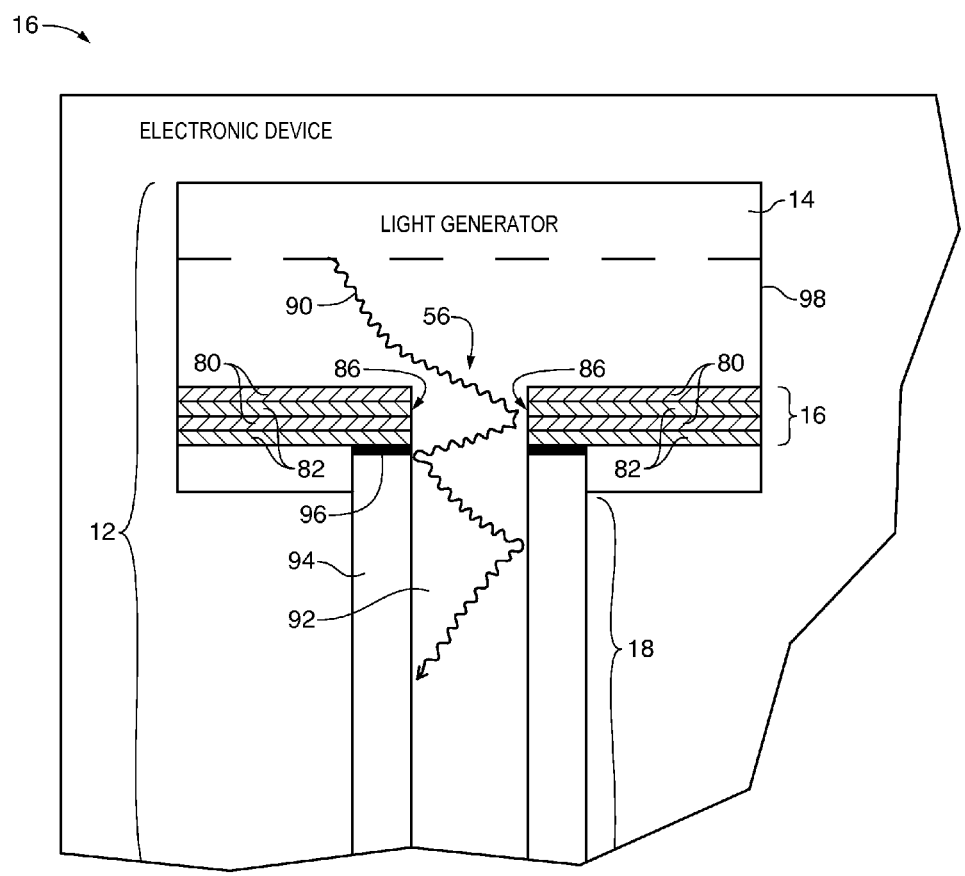
FIG. 6 is a cross-sectional side view of an illustrative plasmonic lens formed from a vertical stack of materials in accordance with an embodiment of the present invention.

FIG. 6 shows a cross-sectional side-view of an illustrative communications module such as communications module 12 of FIG. 1. As shown in FIG. 6, communications module 12 may include a light generating transmitter module such as light generator 14 (sometimes referred to herein as light generating module, light emitting module, transmitter, transmitting module, light transmitting module. etc.), a plasmonic light collector such as plasmonic light collector 1.6 and a transmission cable such as fiber optic cable 18 in a housing such as housing 98. Transmitter 14 may, for example, include one or more a light-emitting diodes, laser transmitters or other optical transmitters for generated light 90. Communications module 12 may also include a plasmonic light collector such as plasmonic light collector 16. Plasmonic light collector 16 of communications module 12 may be used to focus light 90 generated using optical transmitter 14 into a communications cable such as fiber optic cable 18. Fiber optic cable 18 may be used couple communications module 12 to a communications network such as a local area network, a telephone network, an interconnected network of computers, cable television network, etc.

Cable 18 may be formed from a core such as core 92. Core 92 may be formed from a transparent material such as silicon dioxide or other suitable material. Core 92 of cable 18 may be surrounded by one or more wrapping layers such as layer 94. Layer 94 may include a dielectric layer having an index of refraction lower than the index of refraction of core 94 so that light within cable 18 reflects within cable 18 due to the principle of total internal reflection. Layer 94 may include other layers such as a plastic jacket (for example) to be used as a protective housing for cable 18. Cable 18 may be couple to plasmonic light collector 16 using an adhesive such as adhesive 96. Light 90 that has been generated by transmitter 14 may be focused by plasmonic structure 86 of plasmonic light collector 16 into cable 18 for transmission. Circuitry such as processing and control circuitry 26 of FIG. 1 may be used to encode information onto electromagnetic waves (light) for transmission using transmitter 14, plasmonic light collector 16 and cable 18 of communications module 12 of device 10.

Plasmonic light collector 16 may be formed from material stack 84 (including layers 80, 82 and, if desired, other layers). Plasmonic light collector 16 may have one or more openings such an opening 56. Layers 80 and 82 may be formed such that incoming light incident on plasmonic light collector 16 is focused into opening 56 due to interaction of the incoming light with plasmons formed on inner surface 86 of opening 56. Plasmons formed at or near inner surface 86 of opening 56 (sometimes referred to as plasmonic structure 86) may cause incoming light to pass through into cable 18. Opening 56 may be formed in plasmonic lens 50 during a layering process (i.e., layers 80, 82 or other layers) may be screen printed or otherwise patterned onto a temporary or permanent substrate) such that opening 56 is left uncovered. In another example, layers 80, 82, or other layers may be formed onto a temporary or permanent substrate and opening 56 may be opened later using a patterning method such as a lithography, dry etch, wet etch, or other suitable process to form a via or channel such as opening 56 having an (e.g., cylindrical) inner surface such as inner surface 86. Layers 80 and 82 may, if desired, be formed from a single material having regions with differing dielectric properties due to differences in composition or density within the material. Opening 56 in a single material having regions with differing dielectric properties due to differences in composition or density within the material may be formed using a patterning method such as a lithography, dry etch, wet etch, or other suitable process to form a via or channel such as opening 56 having an (e.g., cylindrical) inner surface such as inner surface 86.

As plasmons that interact with incoming light may be formed at the interface between any positive dielectric material and any negative effective dielectric material, changes in the local dielectric function produced by layers 80 and 82 of plasmonic structure 86 in opening 56 may produce plasmonic lensing properties. Replacing conventional lenses or light pipes with plasmonic light collectors formed using a vertical stacking process may provide a variety of performance control options in constructing plasmonic structures 86 (e.g., control over shape, size, depth, etc. of plasmonic structures 86). Inner surface 86 may, for example, be substantially vertical (i.e., perpendicular to the surface of substrate 70) as in 86-1, may be angled with respect to the surface of substrate 70 as in 86-3, or may have curved surfaces having changing angles with respect to the surface of substrate 70 that change as a function of distance from the surface of substrate 70 as in 86-2. The properties of plasmonic structure 86 may be chosen such that interaction between plasmons on plasmonic structure 86 and incoming light 90 limits the bandwidth (i.e., the range of frequencies) of transmission accepted into cable 18. By choosing the properties of plasmonic structure 86 to limit the bandwidth (i.e., the range of frequencies) of transmission accepted into cable 18, plasmonic light collector 16 may be utilized as a color filter (i.e., multiple plasmonic light collectors having different arrangements or stacking thicknesses of layers 80 and 82 of plasmonic structure 86 may provide multiple color filters for transmission into cables such as cable 18).

Various embodiments have been described illustrating electronic devices with imaging modules and/or communications modules having plasmonic light collectors. Plasmonic light collectors may be configured to exploit the interaction between incoming light and plasmons generated on a surface of the plasmonic light collector to redirect the path of the incoming light. Redirecting the incoming light may include focusing the light through openings in the plasmonic light collector onto light absorbing components such as image sensors, fiber optic transmission cables or other components. Plasmonic light collectors may be used to form plasmonic lenses associated with image pixels in an imaging module or to form plasmonic light pipes or plasmonic lenses for use in injecting or transmitting optical communications generated by a transmitter into a fiber optic cable. Plasmonic lenses may be formed by lithography of metallic surfaces, by implantation of negative dielectric constant materials into a dielectric or by stacking and patterning layers of materials having different dielectric properties such as positive and negative effective dielectric constants. Plasmonic image pixels may be smaller and more efficient than conventional image pixels. Plasmonic light guides may introduce light into transmission cables with significantly less signal loss than conventional lenses and light guides.

The foregoing is merely illustrative of the principles of this invention which can be practiced in other embodiments.

What is claimed is:

1. A plasmonic light collector for guiding light into a transmission cable through an opening in the plasmonic light collector, comprising:
   a first dielectric layer, wherein the first dielectric layer has a positive dielectric constant;
   a first negative effective dielectric constant layer formed on the first dielectric layer, wherein the first negative effective dielectric constant layer has a negative effective dielectric constant, wherein the opening comprises an opening in the first dielectric layer and the first negative effective dielectric layer, and wherein the opening is configured to guide the light into the transmission cable using an interaction between the light and plasmons associated with the opening;
   a second dielectric layer formed on the first negative effective dielectric constant layer, wherein the second dielectric layer has a positive dielectric constant; and
   a second negative effective dielectric constant layer formed on the second dielectric layer, wherein the second negative effective dielectric constant layer has a negative effective dielectric constant, and wherein the opening further comprises an opening in the second dielectric layer and the second negative effective dielectric layer.

2. The plasmonic light collector defined in claim 1 wherein the first and second dielectric layers comprise silicon.

3. The plasmonic light collector defined in claim 1 wherein the first and second negative effective dielectric constant layers comprise gold.

4. The plasmonic light collector defined in claim 1 wherein the transmission cable is connected to the plasmonic light collector by adhesive.

5. The plasmonic light collector defined in claim 1, wherein the plasmonic light collector is coupled to a transmitter configured to generate the light and wherein the plasmonic light collector is configured to focus the light generated by the transmitter into the transmission cable.

6. The plasmonic light collector defined in claim 5, wherein the transmission cable comprises a fiber optic transmission cable having an inner core layer surrounded by a wrapping layer, and wherein the plasmonic light collector is configured to focus the light generated by the transmitter into the core layer of the fiber optic transmission cable.

7. The plasmonic light collector defined in claim 1, wherein the first dielectric layer, the second dielectric layer, the first negative effective dielectric constant layer, and the second negative effective dielectric constant layer are configured to filter out a range of frequencies of the light that is guided into the transmission cable.

8. The plasmonic light collector defined in claim 1, wherein the first dielectric layer has a planar surface and wherein the opening in the first dielectric layer, the second dielectric layer, the first negative effective dielectric constant layer, and the second negative effective dielectric constant layer has an inner surface that is substantially perpendicular to the planar surface of the first dielectric layer.

9. The plasmonic light collector defined in claim 1, wherein the first dielectric layer has a planar surface and wherein the opening in the first dielectric layer, the second dielectric layer, the first negative effective dielectric constant layer, and the second negative effective dielectric constant layer has a curved inner surface, wherein the curved inner surface has an angle that changes with respect to the planar surface as a function of distance from the planar surface.

10. An electronic device, comprising:
a transmission cable; and
a light collector, wherein the light collector comprises a first region having a positive dielectric constant, a second region having a negative effective dielectric constant, a third region having a positive dielectric constant, a fourth region having a negative effective dielectric constant, wherein the third region is interposed between the second and fourth regions, wherein the light collector is configured to redirect light incident on the light collector onto the transmission cable using an interaction between the incident light and plasmons generated on a surface of the light collector by the incident light.

11. The electronic device defined in claim 10, wherein the plasmons are generated at at least one of an interface between the third and fourth regions and an interface between the first and second regions.

12. The electronic device defined in claim 11, wherein the light collector is configured to redirect the incident light onto the transmission cable through an opening in the first, second, third, and fourth regions.

13. The electronic device defined in claim 12, wherein the first region is formed from a given material, wherein the first region has a first density, wherein the second region is formed from the given material, and wherein the second region has a second density that is different from the first density.

14. The electronic device defined in claim 12, wherein the first region comprises a first dielectric layer, wherein the second region comprises a second dielectric layer, wherein the third region comprises a third dielectric layer, wherein the fourth region comprises a fourth dielectric layer, wherein the first dielectric layer is formed over the second dielectric layer, wherein the fourth dielectric layer is formed on the third dielectric layer, and wherein the opening is formed in the first, second, third, and fourth dielectric layers.

15. The electronic device defined in claim 12, wherein the third region is formed from a first material, wherein the third region has a first density, wherein the fourth region is formed from a second material, and wherein the fourth region has a second density that is different from the first density.

16. The electronic device defined in claim 12, wherein the transmission cable comprises a fiber optic transmission cable having a core layer and a wrapping layer, wherein the light collector comprises a plasmonic light collector, and wherein the plasmonic light collector is configured to redirect the incident light through the opening onto the core layer of the fiber optic transmission cable.

17. A system, comprising:
a central processing unit;
memory;
input-output circuitry;
an optical light source configured to generate light;
a fiber optic cable; and
a plasmonic light collector, comprising:
a first dielectric layer having a positive dielectric constant; and
a second dielectric layer having a negative effective dielectric constant;
a third dielectric layer having a positive dielectric constant; and
a fourth dielectric layer having a negative effective dielectric constant, wherein an opening is formed in the first, second, third, and fourth dielectric layers, and wherein the plasmonic light collector is configured to guide the light generated by the optical light source onto the fiber optic cable through the opening using an interaction between the light and plasmons generated by the light at at least one of an interface between the first and second dielectric layers and an interface between the third and fourth dielectric layers.

18. The system defined in claim 17, wherein the optical light source comprises a light source selected from the group consisting of: a light-emitting diode and a laser.

19. The system defined in claim 18, further comprising:
processing circuitry, wherein the processing circuitry is configured to encode information onto the light generated by the optical light source.

* * * * *